United States Patent
Lin et al.

(10) Patent No.: US 10,506,720 B2
(45) Date of Patent: Dec. 10, 2019

(54) CARRYING DEVICE, WET ETCHING APPARATUS AND USAGE METHOD THEREOF

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Zhiyuan Lin, Beijing (CN); Yinhu Huang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 660 days.

(21) Appl. No.: 15/105,507

(22) PCT Filed: Jan. 21, 2016

(86) PCT No.: PCT/CN2016/071544
§ 371 (c)(1),
(2) Date: Jun. 16, 2016

(87) PCT Pub. No.: WO2017/016204
PCT Pub. Date: Feb. 2, 2017

(65) Prior Publication Data
US 2017/0202091 A1    Jul. 13, 2017

(30) Foreign Application Priority Data
Jul. 28, 2015 (CN) .......................... 2015 1 0460889

(51) Int. Cl.
*H01L 21/67* (2006.01)
*H05K 3/06* (2006.01)
*H05K 3/00* (2006.01)

(52) U.S. Cl.
CPC ......... *H05K 3/068* (2013.01); *H01L 21/6708* (2013.01); *H01L 21/67103* (2013.01);
(Continued)

(58) Field of Classification Search
CPC .............................. H01L 21/67; H01L 21/683
See application file for complete search history.

(56) References Cited

U.S. PATENT DOCUMENTS

2007/0169702 A1* 7/2007 Khin Teo .......... C23C 16/45565
                                                                118/725
2008/0073324 A1* 3/2008 Nogami ............ H01L 21/02087
                                                                216/58

FOREIGN PATENT DOCUMENTS

CN       1574251 A      2/2005
CN       1748878 A      3/2006
(Continued)

OTHER PUBLICATIONS

Form PCT/ISA/210 issued in corresponding international application No. PCT/CN2016/071544 dated Apr. 12, 2016.
(Continued)

*Primary Examiner* — Robert M Kunemund
(74) *Attorney, Agent, or Firm* — Nath, Goldberg & Meyer; Joshua B. Goldberg

(57) ABSTRACT

The present invention discloses a carrying device, a wet etching apparatus and a usage method thereof. The carrying device comprises a carrying body and a heating unit both disposed under a to-be-processed substrate, the carrying body is used for carrying the to-be-processed substrate such that the to-be-processed substrate is placed inclined; the
(Continued)

heating unit is used for heating the to-be-processed substrate, such that temperature of the to-be-processed substrate rises gradually from a top portion to a bottom portion thereof. In the technical solution of the present invention, by disposing the heating unit under the to-be-processed substrate, the temperature of the to-be-processed substrate rises gradually from the top portion to the bottom portion thereof, thus etch rate of the etchant on the bottom portion of the to-be-processed substrate can be increased, and uniformity of etch rate in the inclined wet etching process is improved.

12 Claims, 3 Drawing Sheets

(52) U.S. Cl.
CPC ............ *H05K 3/002* (2013.01); *H05K 3/0085* (2013.01); *H05K 3/067* (2013.01); *H05K 2203/10* (2013.01); *H05K 2203/1105* (2013.01)

(56) References Cited

FOREIGN PATENT DOCUMENTS

| | | |
|---|---|---|
| CN | 1975983 A | 6/2007 |
| CN | 105140167 A | 12/2015 |
| JP | H1174247 A | 3/1999 |

OTHER PUBLICATIONS

Form PCT/ISA/220 issued in corresponding international application No. PCT/CN2016/071544 dated Apr. 12, 2016.
Form PCT/ISA/237 issued in corresponding international application No. PCT/CN2016/071544 dated Apr. 12, 2016.
First Office Action dated Jun. 2, 2017 corresponding to Chinese application No. 201510460889.6.

\* cited by examiner

US 10,506,720 B2

CARRYING DEVICE, WET ETCHING APPARATUS AND USAGE METHOD THEREOF

This is a National Phase Application filed under 35 U.S.C. 371 as a national stage of PCT/CN2016/071544, filed Jan. 21, 2016, an application claiming the benefit of Chinese Application No. 201510460889.6, filed Jul. 28, 2015, the content of each of which is hereby incorporated by reference in its entirety.

FIELD OF THE INVENTION

The present invention relates to the field of display technology, and particularly, relates to a carrying device, a wet etching apparatus and a usage method thereof.

BACKGROUND OF THE INVENTION

In an existing wet etching apparatus, in order to improving uniformity of wet etching on a large-area to-be-processed substrate, the to-be-processed substrate is generally placed inclined, such that etchant on the to-be-processed substrate can flow along a surface of the to-be-processed substrate under gravity to maintain a good liquid exchange rate, so as to avoid non-uniform etch rate due to stagnation of the etchant on the to-be-processed substrate.

However, in practice, it is found that, in an area at a lower position of the to-be-processed substrate, both the sprayed etchant and the etchant flowing from a higher position are gathered, thus a phenomenon of etchant accumulation may occur in the area at the lower position of the to-be-processed substrate, which results in a relatively low etchant flowing exchange efficiency in this area, and in turn results in a relatively low etch rate in the lower position (because the etchant flowing exchange efficiency is in direct proportion to the etch rate). In the meantime, since the phenomenon of etchant accumulation does not occur in an area at a higher position of the to-be-processed substrate, the etch rate is normal in the higher position.

It can be seen from the above that the wet etching in an inclined manner in the prior art still suffers from the problem of non-uniform etch rate.

SUMMARY OF THE INVENTION

The present invention provides a carrying device, a wet etching apparatus and a usage method thereof, which can effectively improve uniformity of etch rate in an inclined wet etching process.

In order to achieve the above object, the present invention provides a carrying device used for carrying a to-be-processed substrate in a wet etching process, the carrying device comprises:

a carrying body, disposed under the to-be-processed substrate and used for carrying the to-be-processed substrate such that the to-be-processed substrate is placed inclined;

a heating unit, disposed under the to-be-processed substrate and used for heating the to-be-processed substrate, such that the temperature of the to-be-processed substrate rises gradually along an inclined direction from a top portion to a bottom portion thereof.

Optionally, the heating unit includes a plurality of thermal light sources, light generated by the thermal light sources is emitted to a back face of the to-be-processed substrate.

Optionally, distances of the thermal light sources to the to-be-processed substrate are equal, output powers of the thermal light sources are equal, the top portion of the to-be-processed substrate is projected on the heating unit at a first position, and the bottom portion of the to-be-processed substrate is projected on the heating unit at a second position; and density of the provided thermal light sources gradually increases in a direction from the first position to the second position in the heating unit.

Optionally, distances of the thermal light sources to the to-be-processed substrate are equal, all of the thermal light sources are distributed uniformly on the heating unit, the top portion of the to-be-processed substrate is projected on the heating unit at a first position, and the bottom portion of the to-be-processed substrate is projected on the heating unit at a second position; and output powers of the thermal light sources gradually increase in a direction from the first position to the second position in the heating unit.

Optionally, output powers of the thermal light sources are equal, all of the thermal light sources are distributed uniformly on the heating unit, the top portion of the to-be-processed substrate is projected on the heating unit at a first position, and the bottom portion of the to-be-processed substrate is projected on the heating unit at a second position; and distances of the thermal light sources to the to-be-processed substrate gradually decreases in a direction from the first position to the second position in the heating unit.

Optionally, light generated by the thermal light sources is emitted perpendicularly to the back face of the to-be-processed substrate.

Optionally, the thermal light source is an LED lamp.

Optionally, the carrying body comprises a plurality of rollers, and axes of all the rollers are in parallel and located in a same inclined plane.

In order to achieve the above-described object, the present invention further provides a wet etching apparatus comprises a carrying device, wherein the carrying device adopts the above-described carrying device.

In order to achieve the above-described object, the present invention further provides a usage method of a wet etching apparatus, wherein the wet etching apparatus adopts the above-described wet etching apparatus, and the method comprises:

placing a to-be-processed substrate inclined on the carrying body;

heating the to-be-processed substrate by using the heating unit, such that the temperature of the to-be-processed substrate rises gradually from the top portion to the bottom portion thereof; and spraying etchant on a front face of the to-be-processed substrate.

The beneficial effects of the present invention are as follows:

The present invention provides a carrying device, a wet etching apparatus and a usage method thereof. The carrying device is used for carrying a to-be-processed substrate in a wet etching process, the carrying device comprises a carrying body and a heating unit, the heating unit is used for heating the to-be-processed substrate, such that the temperature of the to-be-processed substrate rises gradually from the top portion to the bottom portion thereof, thus the etch rate of the etchant on the bottom portion of the to-be-processed substrate can be increased, the problem that the etchant on the bottom portion of the to-be-processed substrate has a low etch rate due to a low flowing exchange efficiency is solved, and uniformity of etch rate during the inclined wet etching process is improved.

DETAILED DESCRIPTION OF THE EMBODIMENTS

To provide better understanding of the technical solutions of the present invention for those skilled in the art, a carrying device, a wet etching apparatus and a usage method thereof provided by the present invention will be described in detail below with reference to the accompanying drawings.

Figure 1:
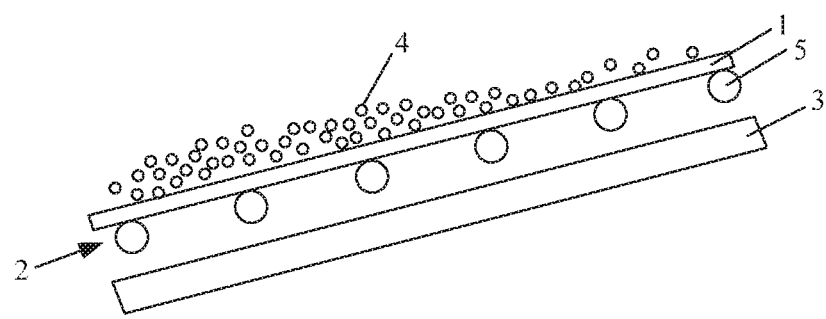
FIG. 1 is a schematic diagram of a carrying device provided by a first embodiment of the present invention.

FIG. 1 is a schematic diagram of a carrying device provided by a first embodiment of the present invention. As shown in FIG. 1, the carrying device is used for carrying a to-be-processed substrate 1 during a wet etching process, specifically, the carrying device includes a carrying body 2 and a heating unit 3, wherein both the carrying body 2 and the heating unit 3 are provided under the to-be-processed substrate 1. The carrying body 2 is in contact with a back face (not a processing face) of the to-be-processed substrate 1, and is used for carrying the to-be-processed substrate 1 such that the to-be-processed substrate 1 is placed inclined. The heating unit 3 is used for heating the to-be-processed substrate 1, so that temperature of the to-be-processed substrate 1 rises gradually from a top portion to a bottom portion along an inclined direction.

It should be noted that the top portion of the to-be-processed substrate 1 in the present invention specifically refers to a portion corresponding to the highest point on the to-be-processed substrate 1 when the to-be-processed substrate 1 is placed inclined; the bottom portion of the to-be-processed substrate 1 in the present invention specifically refers to a portion corresponding to the lowest point on the to-be-processed substrate 1 when the to-be-processed substrate 1 is placed inclined.

In the technical solution of the present invention, by providing a heating unit 3 under the to-be-processed substrate 1, the to-be-processed substrate 1 is heated by the heating unit 3 during a wet etching process, such that the temperature of the to-be-processed substrate 1 in an inclined state rises gradually from the top portion to the bottom portion, and thus the etchant 4 on the bottom portion of the to-be-processed substrate 1 has a higher temperature than the etchant 4 on the top portion of the to-be-processed substrate 1. In the meantime, as the temperature of the etchant 4 on the bottom portion of the to-be-processed substrate) rises, the etch rate increases accordingly, thus the etch rate of the etchant 4 on the bottom portion of the to-be-processed substrate 1 can increase accordingly, thereby solving the problem that the etchant 4 on the bottom portion of the to-be-processed substrate 1 has a relatively low etch rate due to relatively low flowing exchange efficiency, and improving uniformity of etch rate during the inclined wet etching process.

In the present embodiment, the carrying body 2 includes a plurality of rollers 5, axes of all the rollers 5 are in parallel and located in a same inclined plane. In this case, when the to-be-processed substrate 1 is placed on the rollers 5, the to-be-processed substrate 1 is placed inclined. Needless to say, the rollers 5 can further facilitate movement of the carrying body 2.

It should be noted that the above case in which the carrying body 2 is designed to employ rollers 5 is only one alternative solution of the present embodiment, which is not intended to limit the technical solutions of this application.

In the prior art, in order for an operator to observe or monitor the etching process, a light source is generally provided above the to-be-processed substrate 1, and the light generated by the light source is emitted to the front face (processing face) of the to-be-processed substrate 1, and the etching process of the to-be-processed substrate 1 is then observed with human eyes. However, in practice, such observing or monitoring based on a front light source is susceptible to visual interference of the flowing etchant 4, especially in a etching process of a product with high metal wire density or a fine part (for example, a channel part), it is more difficult for the operator to observe with naked eyes, and then judgment is influenced.

To solve the above technical problem, optionally, the heating unit 3 includes a plurality of thermal light sources 6, light generated by the thermal light sources 6 is emitted to the back face of the to-be-processed substrate 1. In this embodiment, the heating unit 3 is formed by the thermal light sources 6, which can not only heat the to-be-processed substrate 1, but also provide the operator with back light sources (the plurality of thermal light sources 6), the light generated by the back light sources will not be disturbed by the flowing etchant 4, thereby facilitating the operator to observe the etching process.

It should be noted that the above case in which the thermal light sources 6 are employed to form the heating unit 3 is only one alternative solution of the present embodiment. Since the thermal light sources can provide the operator with detecting light source while heating the to-be-processed substrate 1, it is unnecessary to provide an additional detecting light source for the etching apparatus, thereby effectively reducing the production cost of the apparatus. The above-described technical means is not intended to limit the technical solutions of this application, the heating unit 3 of this application may also have other structure, for example, a back light source may be separately provided under the to-be-processed substrate 1, or a heating unit that heats in a manner other than optical radiation may be provided, which also fall into the protection scope of the technical solutions of this application.

In the present embodiment, optionally, the thermal light sources 6 are LED lamps.

In the case where the thermal light sources 6 are used to form the heating unit 3, in order to realize that the temperature rises gradually from the top portion to the bottom portion on the to-be-processed substrate 1, the heating unit 3 in the present embodiment may employ the solutions as follows.

Figure 2:
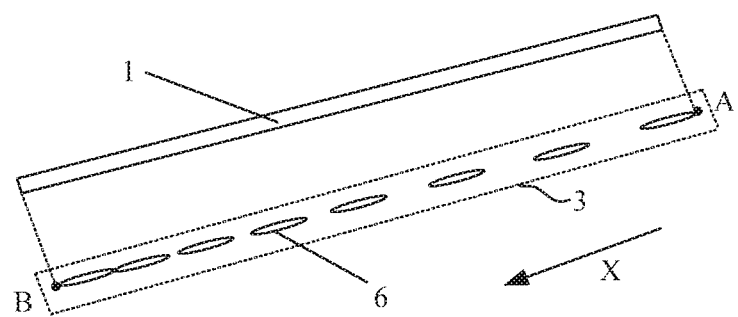
FIG. 2 is a schematic diagram of a structure a heating unit in the first embodiment of the present invention.

FIG. 2 is a schematic diagram of a structure of the heating unit in the first embodiment of the present invention. As shown in FIG. 2, distances between the thermal light sources 6 and the to-be-processed substrate 1 are equal, each thermal light source 6 has the same output power, the top portion of the to-be-processed substrate 1 is projected on the heating unit 3 at a first position A, the bottom portion of the to-be-processed substrate 1 is projected on the heating unit 3 at a second position B, and the thermal light sources 6 in the heating unit 3 are provided in a gradually increasing density in the direction from the first position A to the second position B (the direction indicated by the arrow X in FIG. 2).

In FIG. 2, since the distances between the respective thermal light sources 6 and the to-be-processed substrate 1 are equal, and each thermal light source 6 has the same output power, each thermal light source 6 outputs same amount of energy to the to-be-processed substrate 1 per unit time. In addition, since the thermal light sources 6 in the heating unit 3 are provided in a gradually increasing density in the direction from the first position A to the second position B, energy received on the to-be-processed substrate 1 per unit time gradually increases from the top portion to the bottom portion, and accordingly, the temperature of the to-be-processed substrate 1 gradually rises from the top portion to the bottom portion thereof.

Figure 3:
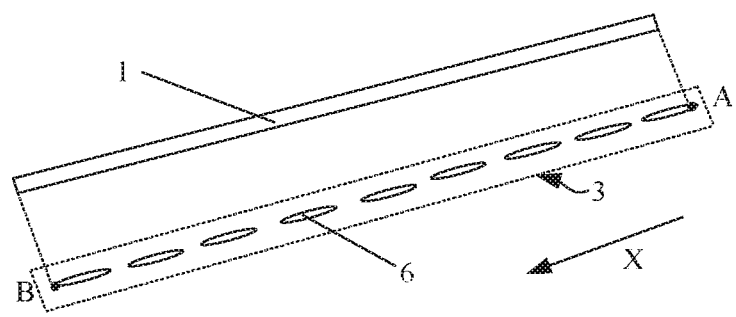
FIG. 3 is a schematic diagram of another structure of the heating unit in the first embodiment of the present invention.

FIG. 3 is a schematic diagram of another structure of the heating unit in the first embodiment of the present invention. As shown in FIG. 3, distances between the thermal light sources 6 and the to-be-processed substrate 1 are equal, all of the thermal light sources 6 are distributed uniformly, the top portion of the to-be-processed substrate 1 is projected on the heating unit 3 at a first position A, the bottom portion of the to-be-processed substrate 1 is projected on the heating unit 3 at a second position B, and output powers of the thermal light sources 6 in the heating unit 3 gradually increases in the direction from the first position A to the second position B (the direction indicated by the arrow X in FIG. 3).

In FIG. 3, since the distances between the respective thermal light sources 6 and the to-be-processed 1 substrate are equal, and all of the thermal light sources 6 are distributed uniformly, i.e., regions having the same area on the to-be-processed substrate 1 are provided with the same number of thermal light sources 6. In addition, since the output powers of the thermal light sources 6 in the heating unit 3 gradually increases in the direction from the first position A to the second position B, energies received on the to-be-processed substrate 1 per unit time gradually increase from the top portion to the bottom portion, and accordingly, the temperature of the to-be-processed substrate 1 gradually rises from the top portion to the bottom portion thereof.

Figure 4:
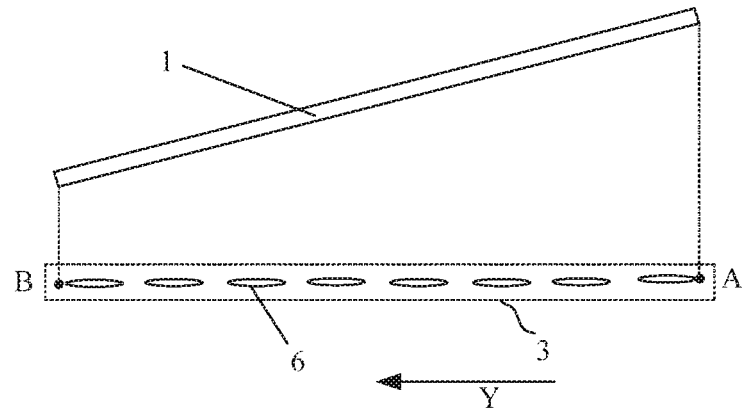
FIG. 4 is a schematic diagram of still another structure of the heating unit in the first embodiment of the present invention.

FIG. 4 is a schematic diagram of still another structure of the heating unit in the first embodiment of the present invention. As shown in FIG. 4, each thermal light source 6 has the same output power, all of the thermal light sources 6 are distributed uniformly, the top portion of the to-be-processed substrate 1 is projected on the heating unit 3 at a first position A, the bottom portion of the to-be-processed substrate 1 is projected on the heating unit 3 at a second position B, and distances between the thermal light sources 6 in the heating unit 3 and the to-be-processed substrate 1 gradually decreases in the direction from the first position A to the second position B (the direction indicated by the arrow Y in FIG. 4).

In FIG. 4, since each thermal light source 6 has the same output power, and the distances between the thermal light sources 6 in the heating unit 3 and the to-be-processed substrate 1 gradually decreases in the direction from the first position A to the second position B, energies outputted by the respective thermal light sources 6 to the to-be-processed substrate 1 gradually decreases (when the thermal light source 6 outputs energy, as the distance increases, energy loss increases, and energy reaching the target position decreases). In addition, since all of the thermal light sources 6 are distributed uniformly, energies received on the to-be-processed substrate 1 per unit time gradually increase from the top portion to the bottom portion, and accordingly, the temperature of the to-be-processed substrate 1 gradually rises from the top portion to the bottom portion thereof.

It should be noted that the case in which all of the thermal light sources 6 are located in a same horizontal plane in FIG. 4 is only exemplary.

In addition, when the thermal light sources 6 are used to form the heating unit 3, the above three implementing solutions provided by the present embodiment are only alternative solutions of this application. For those skilled in the art, it should be known that any other solution that satisfies the condition that energies received on the to-be-processed substrate 1 per unit time gradually increase from the top portion to the bottom portion by adjusting spatial locations and/or output powers of the thermal light sources 6 falls into the protection scope of this application, and will not be listed one by one herein.

In the embodiments, in order to reduce energy lost during the heating process of the to-be-processed substrate 1 using the thermal light sources 6, light generated by the thermal light sources 6 may be emitted perpendicularly to the back face of the to-be-processed substrate 1, thereby improving the output efficiency of the thermal light sources 6.

In addition, when the carrying body 2 includes a plurality of rollers 5, and the heating unit 3 includes a plurality of thermal light sources 6, the thermal light sources 6 may be provided in gaps between adjacent rollers 5 (the case is not illustrated in figures), in this case, distances of the thermal light sources 6 to the to-be-processed substrate 1 can be further reduced, thereby further improving the output efficiency of the thermal light sources 6.

The first embodiment of the present invention provides a carrying device, the carrying device is used for carrying the to-be-processed substrate in a wet etching process, wherein the carrying device includes the carrying body and the heating unit, the heating unit is used for heating the to-be-processed substrate such that temperature of the to-be-processed substrate gradually rises from the top portion to the bottom portion thereof, thus the etch rate of the etchant on the bottom portion of the to-be-processed substrate increases, the problem that the etchant on the bottom portion of the to-be-processed substrate has a relatively low etch rate due to relatively low flowing exchange efficiency is solved, and the uniformity of etch rate during the inclined wet etching process is improved.

A second embodiment of the present invention provides a wet etching apparatus, which includes a carrying device, wherein the carrying device is the carrying device provided in the first embodiment, detailed contents may refer to the description in the first embodiment, and is not repeated herein.

Figure 5:
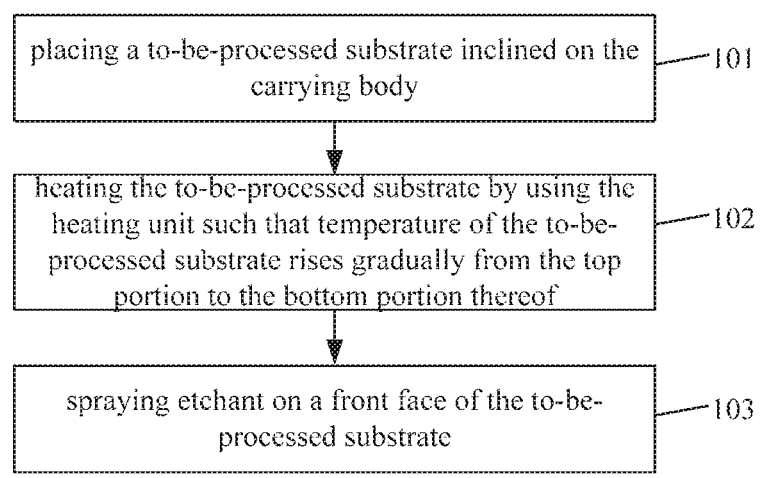
FIG. 5 is a flowchart of a usage method of a wet etching apparatus provided by a third embodiment of the present invention.

FIG. 5 is a flowchart of a usage method of a wet etching apparatus provided by a third embodiment of the present invention. As shown in FIG. 5, the wet etching apparatus is the wet etching apparatus in the above second embodiment, and the usage method of the wet etching apparatus includes:

step 101: placing a to-be-processed substrate inclined on the carrying body;

step 102: heating the to-be-processed substrate by using the heating unit such that temperature of the to-be-processed substrate gradually rises from a top portion to a bottom portion thereof; and step 103: spraying etchant on a front face of the to-be-processed substrate.

It should be noted that after the to-be-processed substrate is placed inclined on the carrying body, the to-be-processed substrate may be firstly preheated through step 102, and then the to-be-processed substrate is wet etched through step 103 while continuing the heating process of step 102, so as to ensure that the temperature of the to-be-processed substrate gradually rises from the top portion to the bottom portion.

It could be understood that the above embodiments are exemplary embodiments used for describing the principle of the present invention only, but the present invention is not limited thereto. For those skilled in the art, various variations and modifications may be made without departing from the spirit and substance of the present invention, and these variations and modifications are considered as falling into the protection scope of the present invention.

The invention claimed is:

1. A carrying device, used for carrying a to-be-processed substrate in a wet etching process, the carrying device comprising:
   a carrying body, disposed under the to-be-processed substrate and used for carrying the to-be-processed substrate such that the to-be-processed substrate is placed inclined;
   a heating unit, disposed under the to-be-processed substrate and used for heating the to-be-processed substrate, such that temperature of the to-be-processed substrate rises gradually along an inclined direction from a top portion to a bottom portion thereof, the heating unit includes a plurality of thermal light sources, and light generated by the thermal light sources is emitted to a back face of the to-be-processed substrate, wherein
   distances of the thermal light sources to the to-be-processed substrate are equal, the thermal light sources have equal output powers, the top portion of the to-be-processed substrate is projected on the heating unit at a first position, and the bottom portion of the to-be-processed substrate is projected on the heating unit at a second position; and
   density of the provided thermal light sources gradually increases in a direction from the first position to the second position in the heating unit.

2. A carrying device, used for carrying a to-be-processed substrate in a wet etching process, the carrying device comprising:
   a carrying body, disposed under the to-be-processed substrate and used for carrying the to-be-processed substrate such that the to-be-processed substrate is placed inclined;
   a heating unit, disposed under the to-be-processed substrate and used for heating the to-be-processed substrate, such that temperature of the to-be-processed substrate rises gradually along an inclined direction from a top portion to a bottom portion thereof, the heating unit includes a plurality of thermal light sources, and light generated by the thermal light sources is emitted to a back face of the to-be-processed substrate, wherein
   distances of the thermal light sources to the to-be-processed substrate are equal, all of the thermal light sources are distributed uniformly on the heating unit, the top portion of the to-be-processed substrate is projected on the heating unit at a first position, and the bottom portion of the to-be-processed substrate is projected on the heating unit at a second position; and
   output powers of the thermal light sources gradually increase in a direction from the first position to the second position in the heating unit.

3. A carrying device, used for carrying a to-be-processed substrate in a wet etching process, the carrying device comprising:
   a carrying body, disposed under the to-be-processed substrate and used for carrying the to-be-processed substrate such that the to-be-processed substrate is placed inclined;
   a heating unit, disposed under the to-be-processed substrate and used for heating the to-be-processed substrate, such that temperature of the to-be-processed substrate rises gradually along an inclined direction from a top portion to a bottom portion thereof, the heating unit includes a plurality of thermal light sources, and light generated by the thermal light sources is emitted to a back face of the to-be-processed substrate, wherein
   output powers of the thermal light sources are equal, all of the thermal light sources are distributed uniformly on the heating unit, the top portion of the to-be-processed substrate is projected on the heating unit at a first position, and the bottom portion of the to-be-processed substrate is projected on the heating unit at a second position; and
   distances of the thermal light sources to the to-be-processed substrate gradually decrease in a direction from the first position to the second position in the heating unit.

4. The carrying device of claim 1, wherein light generated by the thermal light sources is emitted perpendicularly to the back face of the to-be-processed substrate, the thermal light source is an LED lamp, and the carrying body comprises a plurality of rollers, and axes of all the rollers are in a parallel and located in a same inclined plane.

5. The carrying device of claim 2, wherein light generated by the thermal light sources is emitted perpendicularly to the back face of the to-be-processed substrate, the thermal light source is an LED lamp, and the carrying body comprises a plurality of rollers, and axes of all the rollers are in parallel and located in a same inclined plane.

6. The carrying device of claim 3, wherein light generated by the thermal light sources is emitted perpendicularly to the back face of the to-be-processed substrate, the thermal light source is an LED lamp, and the carrying body comprises a plurality of rollers, and axes of all the rollers are in parallel and located in a same inclined plane.

7. A wet etching apparatus, comprising the carrying device of claim 1, light generated by the thermal light sources is emitted perpendicularly to the back face of the to-be-processed substrate, the thermal light source is an LED lamp, and the carrying body comprises a plurality of rollers, and axes of all the rollers are in parallel and located in a same inclined plane.

8. A wet etching apparatus, comprising the carrying device of claim 2, light generated by the thermal light sources is emitted perpendicularly to the back face of the to-be-processed substrate, the thermal light source is an LED lamp, and the carrying body comprises a plurality of rollers, and axes of all the rollers are in parallel and located in a same inclined plane.

9. A wet etching apparatus, comprising the carrying device of claim 3, light generated by the thermal light sources is emitted perpendicularly to the back face of the to-be-processed substrate, the thermal light source is an LED lamp, and the carrying body comprises a plurality of rollers, and axes of all the rollers are in parallel and located in a same inclined plane.

10. A usage method of the wet etching apparatus of claim 7, comprising:
    placing a to-be-processed substrate inclined on the carrying body;
    heating the to-be-processed substrate by using the heating unit such that temperature of the to-be-processed substrate rises gradually from a top portion to a bottom portion; and
    spraying etchant on a front face of the to-be-processed substrate.

11. A usage method of the wet etching apparatus of claim 8, comprising:
    placing a to-be-processed substrate inclined on the carrying body;
    heating the to-be-processed substrate by using the heating unit such that temperature of the to-be-processed substrate rises gradually from a top portion to a bottom portion; and
    spraying etchant on a front face of the to-be-processed substrate.

12. A usage method of the wet etching apparatus of claim 9, comprising:
    placing a to-be-processed substrate inclined on the carrying body;
    heating the to-be-processed substrate by using the heating unit such that temperature of the to-be-processed substrate rises gradually from a top portion to a bottom portion; and
    spraying etchant on a front face of the to-be-processed substrate.

* * * * *